United States Patent

Marguinaud et al.

[11] Patent Number: 5,886,913
[45] Date of Patent: Mar. 23, 1999

[54] METHOD OF SYNTHESIZING A FINITE IMPULSE RESPONSE DIGITAL FILTER AND FILTER OBTAINED BY THIS METHOD

[75] Inventors: André Marguinaud, Palaiseau; Dietmar W. Schill, Nürmberg, both of France

[73] Assignee: Alcatel Alsthom Compagnie Generale D'Electricite, Paris, France

[21] Appl. No.: 871,579

[22] Filed: Jun. 9, 1997

[51] Int. Cl.[6] .................................................. G06F 17/10
[52] U.S. Cl. ........................ 364/724.011; 364/724.1; 364/724.16
[58] Field of Search ................ 364/724.011, 724.16, 364/724.013, 724.1; 84/624; 702/190

[56] References Cited

U.S. PATENT DOCUMENTS

| | | | |
|---|---|---|---|
| 4,116,103 | 9/1978 | Deutsch | 84/624 |
| 4,748,578 | 5/1988 | Legadec et al. | 364/724.1 |
| 5,204,827 | 4/1993 | Fujita et al. | 364/724.1 |
| 5,335,194 | 8/1994 | Clayton et al. | 364/724.1 |
| 5,511,014 | 4/1996 | Mourot et al. | 364/724.011 |
| 5,602,762 | 2/1997 | Lyon | 702/190 |

*Primary Examiner*—Ayaz R. Sheikh
*Assistant Examiner*—Douglas S. Lee
*Attorney, Agent, or Firm*—Sughrue, Mion, Zinn, Macpeak & Seas, PLLC

[57] ABSTRACT

A method of synthesizing a finite impulse response digital filter includes a phase of calculating the impulse response g(t) of an analog filter the transfer function of which is defined by a predetermined bandwidth B, shape factor SF and out-band attenuation level A. The coefficients of the digital filter are extracted by sampling the resulting impulse response. The calculation phase consists in expanding the impulse response into an integer number M of Hermite functions predetermined in accordance with the shape factor SF. The coefficient extraction phase includes sampling of the expanded impulse response after the calculation phase in a time window the duration of which is dependent on the out-band attenuation level A using a sampling period Δt that is dependent on the bandwidth B.

6 Claims, 6 Drawing Sheets

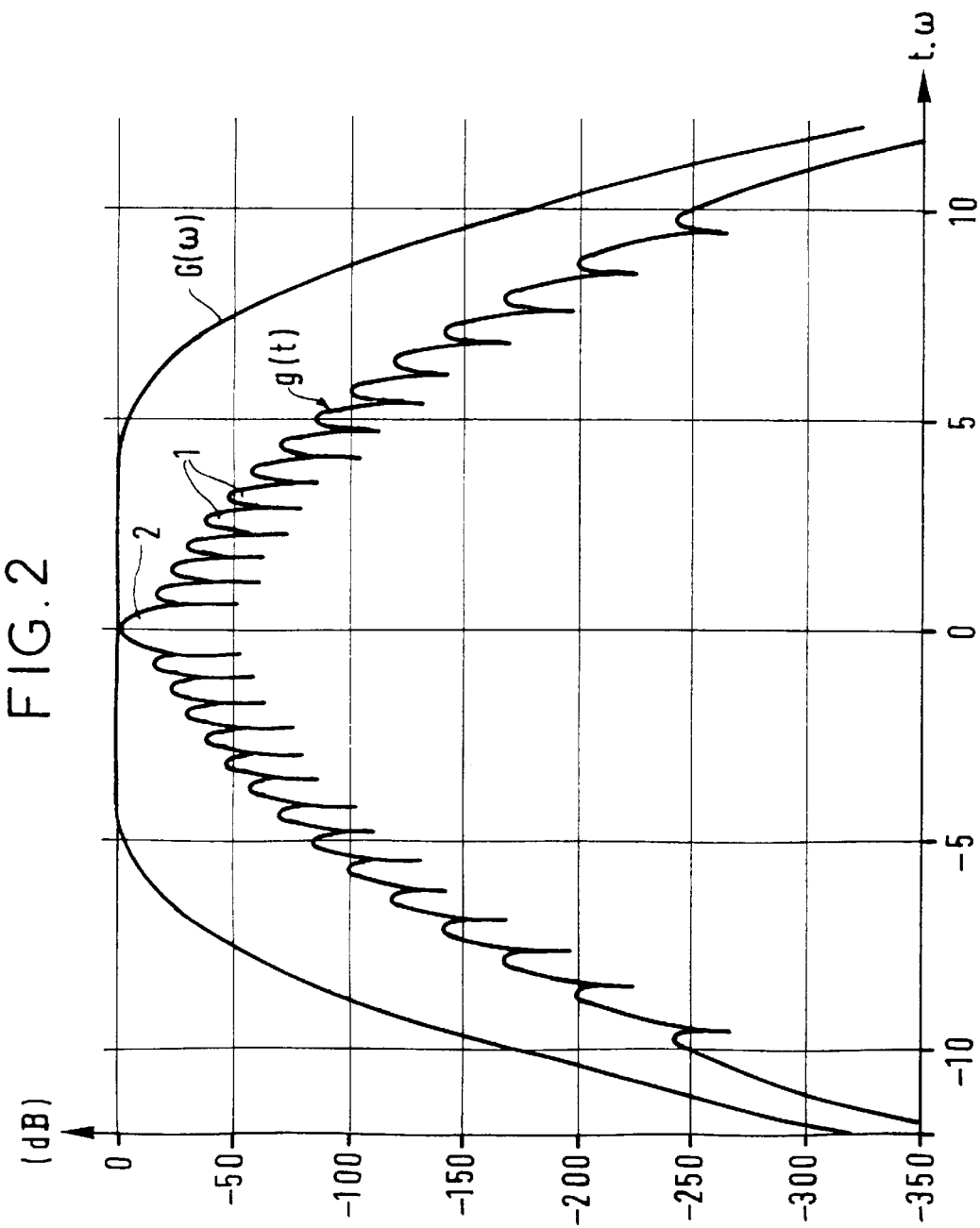

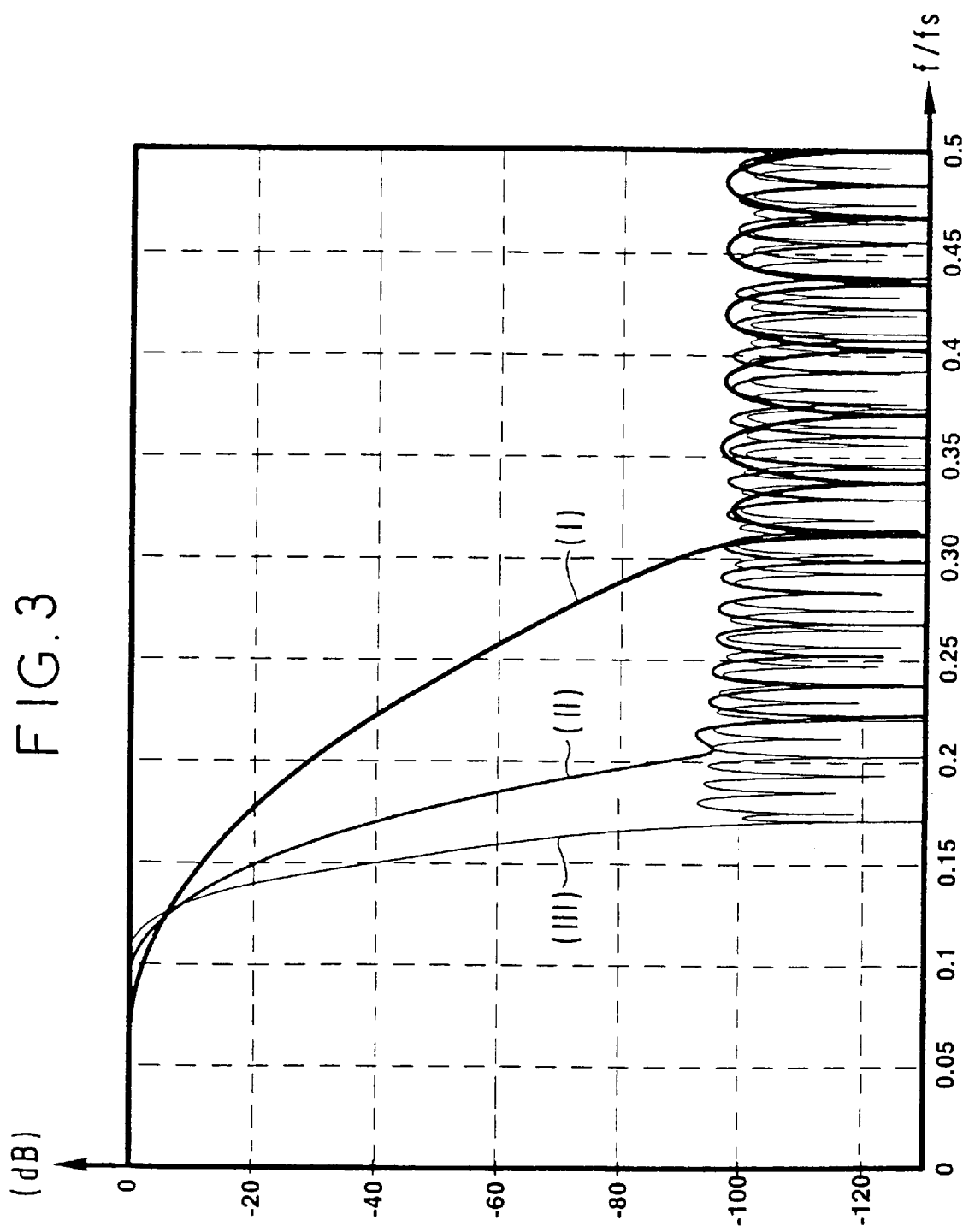

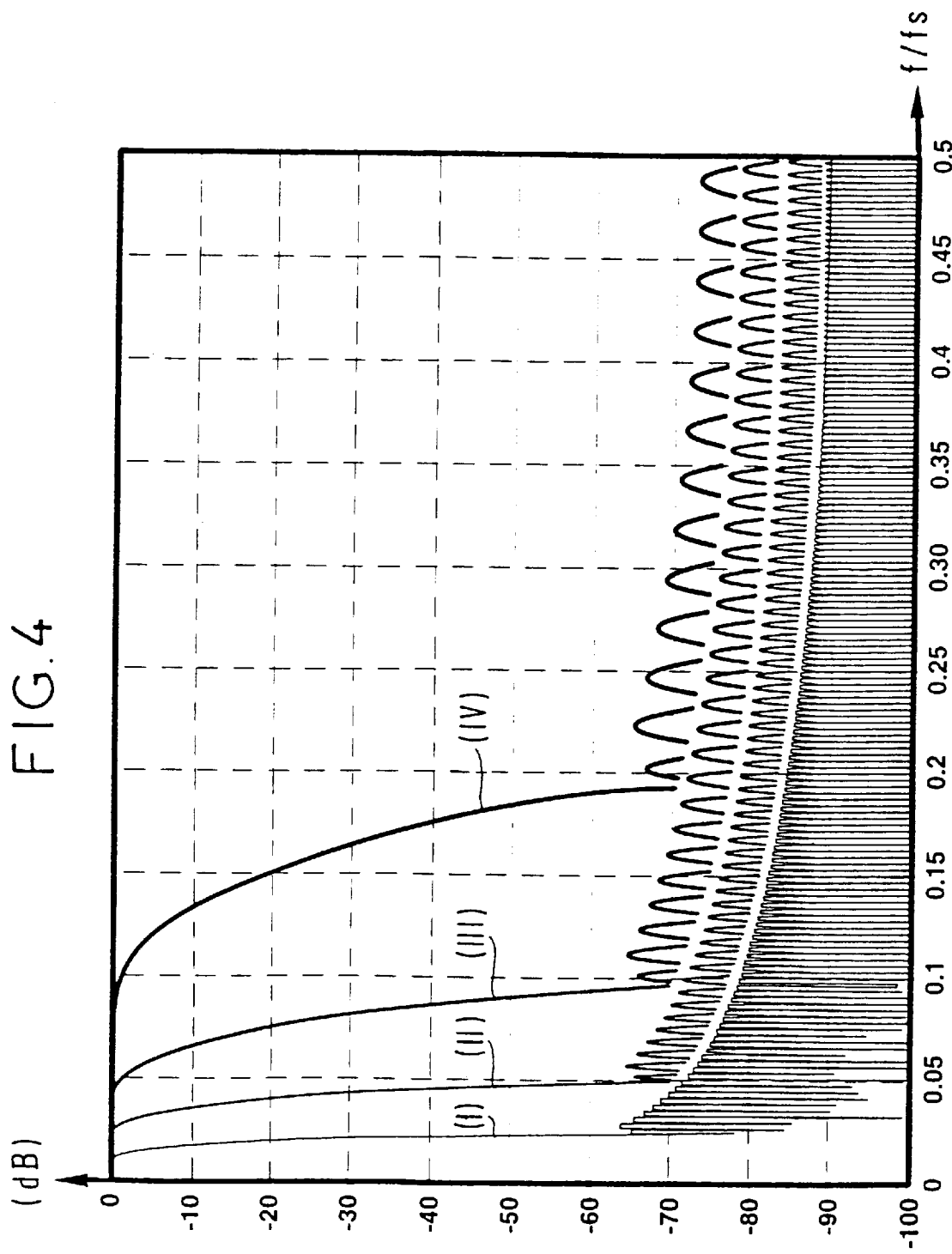

METHOD OF SYNTHESIZING A FINITE IMPULSE RESPONSE DIGITAL FILTER AND FILTER OBTAINED BY THIS METHOD

BACKGROUND OF THE INVENTION

1. Field of the Invention

The present invention concerns a method of synthesizing a finite impulse response digital filter and a digital filter obtained by this method.

2. Description of the Prior Art

Filtering to extract the wanted signal and eliminate interference is an essential operation in the field of signal processing. There is therefore an abundant literature dedicated to it.

Digital signal processing has the advantage over analog processing that it enables exact reproduction of the signals and the processing operations without any aging process intervening. For this reason the remainder of this disclosure is restricted to the field of digital filters.

Among the various types of digital filter known in themselves, a distinction is drawn between finite impulse response (FIR) digital filters and infinite impulse response (IIR) digital filters.

An FIR digital filter is a time-invariant discrete linear system the output of which is determined by a weighted sum of a finite set of input samples, the weighting coefficients comprising the coefficients or weights of the filter defining its impulse response. A filter of this kind is usually called a non-recursive filter because its implementation does not require any feedback loop.

An IIR digital filter is also a time-invariant discrete linear system, but one in which the output is determined by a weighted sum of a certain number of inputs and a certain number of previous outputs of the same filter. This type of filter, the implementation of which requires a feedback loop to sample the previous outputs, is usually called a recursive filter.

FIR filters have many advantages, including digital stability and phase linearity. Also, an FIR filter is less complex to implement that an IIR filter having a comparable frequency characteristic. These considerations indicate the benefit of optimizing the design and implementation of FIR filters.

As a general rule, in synthesizing an FIR digital filter the first step is to synthesize an analog filter. The impulse response of this analog filter is then sampled to extract the coefficients of the FIR digital filter.

Existing methods of synthesizing FIR digital filters can be divided into two groups, respectively corresponding to the frequency domain and the time domain. These groups are, respectively, the so-called characteristic methods in which a frequency characteristic is imposed and a filter is calculated with a transfer function or frequency response providing the best match to the frequency characteristic, and the so-called windowing methods. Neither method gives a direct relation between the coefficients of the FIR filter in the time domain and the transfer function of the filter in the frequency domain. In the case of characteristic methods, this leads to Remez algorithms that are difficult to implement; in the case of windowing methods, performance is insufficient in most cases.

An aim of the present invention is to propose a new method of synthesizing an FIR digital filter enabling the filter characteristics to be specified simultaneously in the time domain, in order to define the complexity of the filter, and in the frequency domain, in order to define the performance of the filter.

SUMMARY OF THE INVENTION

To this end, the present invention consists in a method of synthesizing a finite impulse response digital filter including a phase of calculating the impulse response g(t) of an analog filter the transfer function of which is defined by a predetermined bandwidth B, shape factor SF and out-band attenuation level A and a phase of extracting the coefficients of the digital filter by sampling the impulse response, wherein the calculation phase consists in expanding the impulse response into an integer number M of Hermite functions predetermined in accordance with the shape factor SF and the coefficient extraction phase includes sampling of the expanded impulse response after the calculation phase in a time window the duration of which is dependent on the out-band attenuation level A using a sampling period $\Delta t$ that is dependent on the bandwidth B.

In a preferred embodiment of the method of the invention, said calculation phase includes the following steps:

- looking for a decomposition of the transfer function of the analog filter in the form of a sum of the M first even Hermite functions weighted by weighting coefficients such as the nth derivatives of said sum, n being an integer varying from 1 to 2M-1, are null for the null frequencies;
- deducing the development of the impulse response by inverse Fourier transformation of said sum.

The invention also consists in a finite impulse response digital filter including means for storing coefficients extracted by previous synthesis of the filter by a method as claimed in any one of the preceding claims to implement a filter with minimal bandwidth B, stiffness SF and out-band attenuation A that are predetermined, and means for modifying the bandwidth by selecting from the coefficients stored a number reduced by a given factor k to enable a filtering operating with bandwidth kB on samples of an input signal.

The various aspects of the present invention will be better understood from the following description of the synthesis of a low-pass digital filter given with reference to the accompanying drawings.

BRIEF DESCRIPTION OF THE DRAWINGS

FIG. 2 shows the impulse response and the transfer function of a filter obtained by the synthesis method of the invention using the first fifteen even Hermite functions.

FIG. 3 shows the influence of the number M of Hermite functions used on the shape factor of the filter synthesized by the method of the invention.

FIG. 4 shows the influence of the sampling period on the −6 dB bandwidth of the filter synthesized by the method of the invention.

DETAILED DESCRIPTION OF THE PREFERRED EMBODIMENT

Firstly, it will be recalled that the impulse response g(t) of an analog filter is related to the transfer function or frequency response G(ω) of the filter by the equations:

$$G(\omega) = TF[g(t)] = \frac{1}{\sqrt{2\pi}} \int_{-\infty}^{+\infty} g(t)e^{-j\omega t}dt \qquad (1)$$

$$g(t) = TF^{-1}[G(\omega)] = \frac{1}{\sqrt{2\pi}} \int_{-\infty}^{+\infty} G(\omega)e^{j\omega t}dt$$

in which TF[ ] represents the Fourier transform operator anq TF$^{-1}$[ ] represents the inverse Fourier transform operator.

The present invention is based on the property whereby any finite analog signal, in this instance any finite analog impulse response of a filter, can be approximated by an expansion based on the characteristic functions of the Fourier transform. This property makes it possible to establish an immediate correspondence between the impulse response of a filter and its transfer function. A function ψ(x) is a characteristic function of the operator TF[ ] if it satisfies the equation:

$$TF[\psi(x)] = \psi(x) \qquad (2)$$

in which λ is a complex number known as the characteristic value.

The aim is to produce filters which have the shortest possible impulse response for a given characteristic. The remainder of this disclosure is therefore restricted to characteristic functions that tend towards zero at infinity, these characteristic functions being known as summable square functions.

It can be shown that the only characteristic functions of the Fourier transform operator that satisfy the above criterion are the Hermite functions defined by the following equation:

$$\psi_n(x) = (-1)^n e^{x^2/2} \frac{d^n}{dx^n}[e^{-x^2}] \qquad (3)$$

in which $$\frac{d^n}{dx^n}$$

[ ] represents the nth derivative operator relative to the variable x.

The characteristic values $\lambda_n$ associated with the Hermite functions $\psi_n(x)$ are such that:

$$\lambda_{n=(-j)^n}$$

It can also easily be shown that the Hermite functions satisfy the equation:

$$\int_{-\infty}^{+\infty} \psi_n(x)\psi_m(x)dx = 2^n n! \sqrt{\lambda}\delta_{m,n} \qquad (4)$$

with $\delta_{m,n}=0$ for m=n,
and $\delta_{m,n}=1$ for m≠n,
this equation representing the fact that the Hermite functions are orthogonal.

FIGS. 1A through 1D show the first four normalized Hermite functions.

Consequently, the Hermite functions constitute a complete orthogonal base on which it is possible to expand any signal or any finite analog function. In particular, any impulse response or any transfer function of a finite impulse response analog filter can be expanded in the form of a weighted sum of the first M Hermite functions.

In the particular simplest case of a low-pass filter, the theoretical transfer function of the filter has a constant value within the wanted band. The aim of the method of the invention is to synthesize a low-pass filter with as flat a transfer function as possible within the wanted band.

Figure 1A:
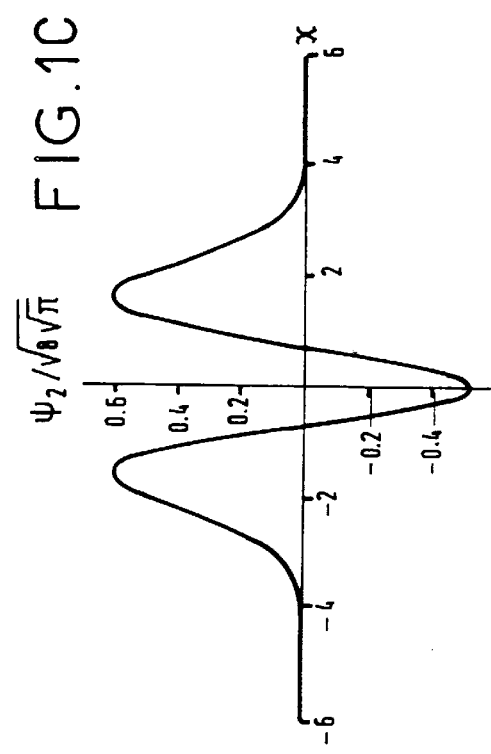
FIGS. 1A through 1D show the first four Hermite functions.
Figure 1B:
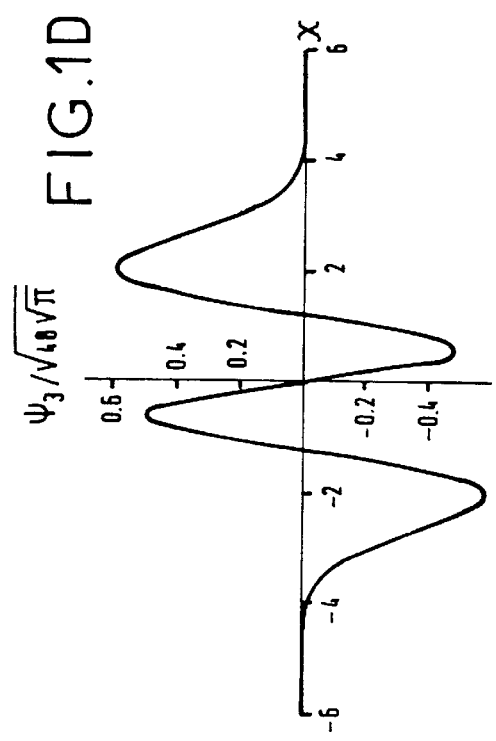
Figure 1C:
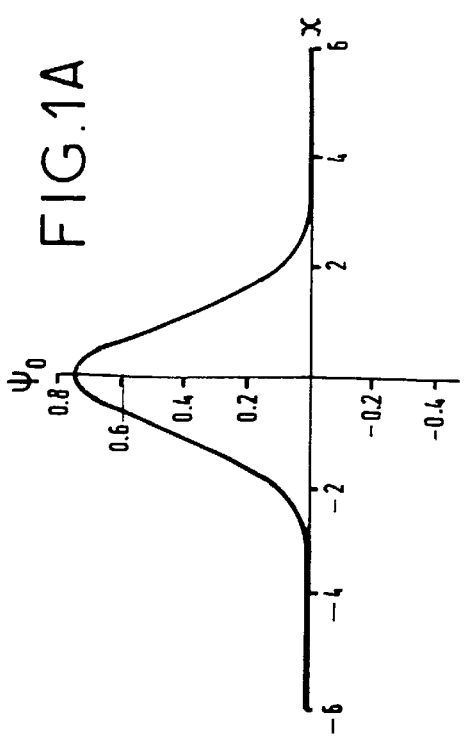
Figure 1D:
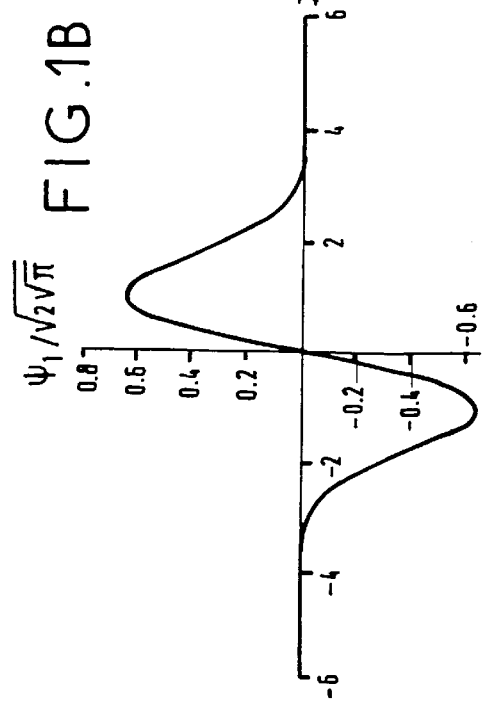

Analysis of the Hermite functions shows that all the odd Hermite functions cancel out at the zero frequency (see the curves in FIGS. 1B and 1D, for example). As a result these odd Hermite functions are of little benefit for synthesizing a low-pass filter since they would not allow a flat band to be obtained at the central frequencies. Moreover, the characteristic values $\lambda_n$ associated with these odd functions are complex. Using them would therefore lead to complex impulse responses that are much more difficult to implement.

Thus in the remainder of this disclosure it is assumed that any transfer function of a low-pass filter can be written in the form of a weighted sum of the first M even Hermite functions, as follows:

$$G(\omega) = \sum_{i=0}^{M-1} a_i \psi_{2i}(\omega) \qquad (5)$$

To obtain a flat band filter it is sufficient, in accordance with the invention, to impose the cancellation of the first nth derivatives, the integer n varying from 1 to 2M-1, of the sum G(ω) given by equation (5) for the zero frequency.

From the above equation (3) defining a Hermite function it can be shown that all the odd derivatives of G(ω) are zero at the zero frequency regardless of the values assumed by the weighting coefficients.

As a result a flat band filter can be obtained by canceling only the first M-1 even derivatives of G(ω) for ω equal to 0.

The condition for flatness in the wanted band is therefore embodied in the following linear system of M equations:

$$\sum_{i=0}^{M-1} a_i \psi_{2i}(0) = G$$

$$\sum_{i=0}^{M-1} a_i \psi_{2i}''(0) = 0$$

.
.
.

$$\sum_{i=0}^{M-1} a_i \psi_{2i}^{(2(M-1))}(0) = 0$$

in which G represents the constant value of the transfer function within the wanted band, $\psi_{2i}''(0)$ represents the second derivative relative to the variable ω of the Hermite function $\psi_{2i}()$ for ω equal to 0, and $\psi_{2i}^{(2(M-1))}(0)$ represents the 2(M-1)th derivative relative to the variable ω of the Hermite function $\psi_{2i}()$ for ω equal to 0.

Solving the above system by any method known in itself for solving a linear system determines the coefficients $a_i$ weighting the sum of the first M Hermite functions used in accordance with the invention to expand the transfer function G(ω).

One particular method of solving the above system (S) is to look for an expression for G(ω) of the form:

$$G(\omega) = e^{-\omega^2/2} P(\omega)$$

in which $P(\omega)$ is a $2(M-1)$th degree polynomial in $\omega$ for which the first $2(M-1)$ derivatives are zero for $\omega$ equal to 0.

Using the first terms in the integer series expansion of the exponential function $e^{\omega^2/2}$ relative to the variable $\omega^2/2$, it can be shown that the polynomial $P(\omega)$ is expressed in the form:

$$P(\omega) = \sum_{k=0}^{M-1} \frac{\omega^{2k}}{2^k k!}$$

so that:

$$G(\omega) = e^{-\omega^2/2} \sum_{k=0}^{M-1} \frac{\omega^{2k}}{2^k k!} \qquad (6)$$

The polynomial $P(\omega)$ is therefore identified with a weighted sum of M Hermite polynomials $H_{2i}(\omega)$, these polynomials being related to the Hermite functions by the equation:

$$\psi_{2i}(\omega) = e^{-\omega^2/2} H_{2i}(\omega)$$

This process yields the weighting coefficients $a_i$ in the above equation (5). The impulse response $g(t)$ is then immediately obtained because of the equation (2) satisfied by the Hermite functions.

FIG. 2 shows on the same diagram curves representing the impulse response $g(t)$ and the transfer function $G(\omega)$ of a low-pass filter obtained by summation in accordance with the invention of the first 15 even Hermite functions, both curves being plotted on a logarithmic scale.

FIG. 2 shows that the impulse response $g(t)$ has 29 lobes. Among these lobes, 28 lobes 1 have substantially the same width and are on opposite sides of the origin, and one lobe 2 centered on the origin has substantially twice this width. This result can be generalized to any low-pass filter resulting from expansion using a weighted sum of the first M even Hermite functions. In this case, the impulse response of the low-pass filter comprises $2M-1$ lobes.

The foregoing disclosure shows how to obtain the impulse response of an analog low-pass filter using any number M of first even Hermite functions without imposing any operational characteristics.

It now remains to define the operational characteristics of the filter to be synthesized and to extract the coefficients of the associated digital filter Ad by sampling the impulse response $g(t)$.

From the operational point of view, a low-pass filter is defined by three operational parameters, namely a bandwidth B (for example a $-6$ dB bandwidth), a shape factor or stiffness SF, defined for example as the ratio of the $-6$ dB bandwidth to a $-60$ dB bandwidth, and a minimum out-band attenuation level A.

From the technical point of view, and in accordance with the method of the invention, the filter is defined by three technical parameters, namely the number M of Hermite functions used in the expansion, the duration of the sampling window and the sampling period $\Delta t$ in that window.

Our experiments have shown that each of these three technical parameters operates on only one of the three operational parameters, with sufficient approximation in practise.

To be more precise, it can be shown firstly that the number M of Hermite functions used to expand the transfer function of the filter fixes the value of the shape factor SF of the filter. This result is shown in FIG. 3 which represents, on a logarithmic scale, the transfer function of a filter obtained with 3 Hermite functions (curve (I)), 12 Hermite functions (curve (II)), and 36 Hermite functions (curve (III)), respectively.

These curves show that the out-band attenuation level is substantially equal to $-93$ dB and that the $-6$ dB bandwidth remains equal to $2\times0.125$ (standardized frequency $f/f_s$) regardless of the number of Hermite functions used.

Only the shape factor SF is affected by the variation in M. An empirical approximation of the value of the shape factor SF of the filter as a function of the number M of Hermite functions is obtained from the following equation:

$$SF = 1 + \log_{10}\left(\frac{M+8}{M+28}\right)$$

It can also be shown that, for a given number M of Hermite functions constituting the expansion, and for a sampling window of fixed width T, the variation in the sampling period $\Delta t$ leads to a proportionate variation in the bandwidth B of the filter.

This result can be seen in FIG. 4 which represents, on a logarithm scale, the transfer functions of digital filters obtained from 10 Hermite functions, with a sampling window of width $10t_0$, where $t_0$ is a predetermined time interval, and for different values of the sampling period $\Delta t$, namely $t_0/32$ (curve (I)), $t_0/16$ (curve (II)), $t_0/8$ (curve (III)) and $t_0/4$ (curve (IV)). To avoid overcomplicating the figure only the top parts of the secondary lobes are shown for the curves (II), (III) and (IV). On comparing the four curves, it is seen that only the bandwidth C varies in the same proportions as the period $\Delta t$, the other operational parameters, namely the out-band attenuation A and the shape factor SF, remaining substantially constant.

Figure 5:
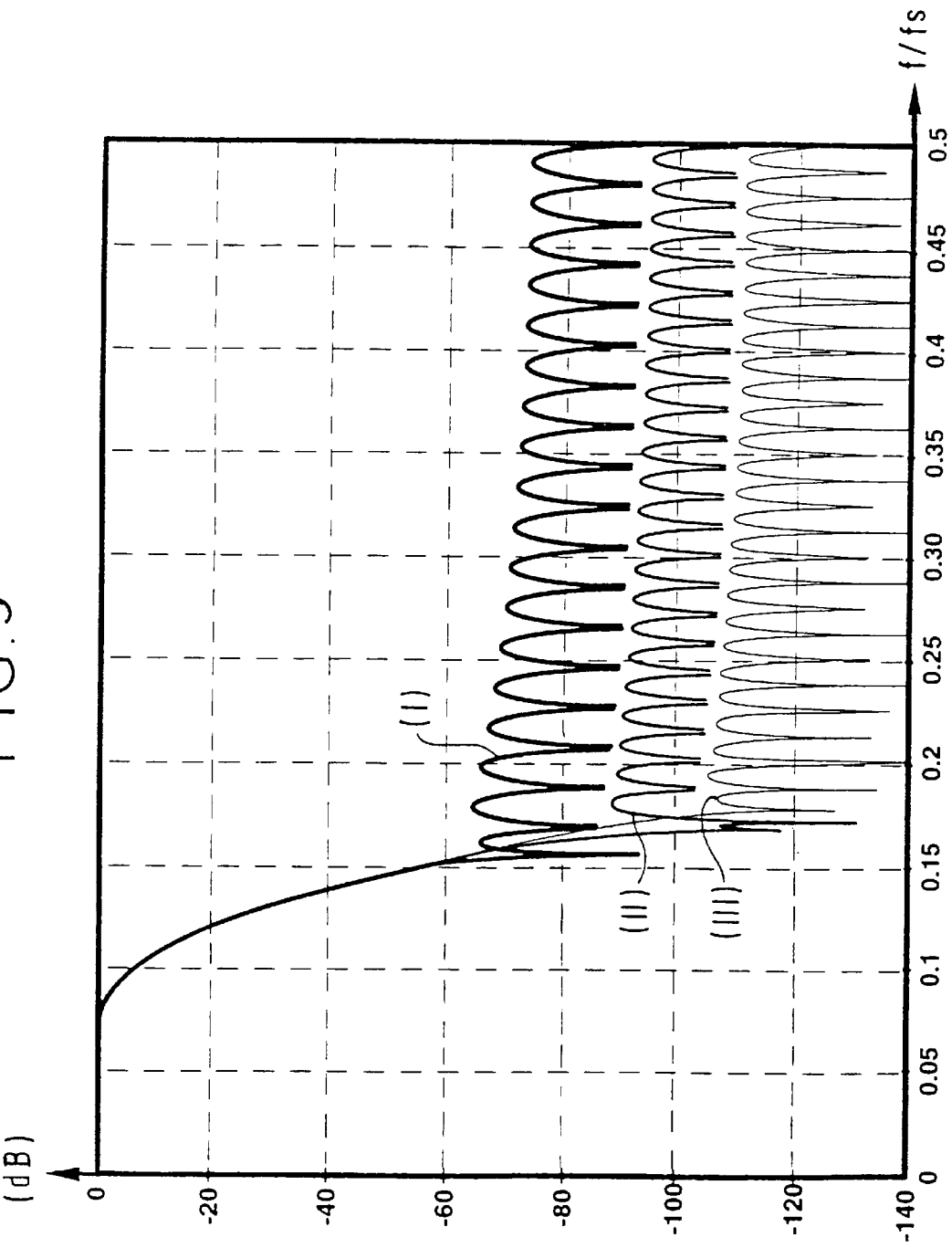
FIG. 5 shows the influence of the duration of the sampling window on the out-band attenuation level of the filter synthesized by the method of the invention.

Finally, the last operational parameter, i.e. the out-band attenuation A, can be fixed by the sole choice of the duration T of the sampling window, as shown in FIG. 5. This figure represents, on a logarithmic scale, the transfer function of digital filters obtained from 10 Hermite functions, sampling with a constant sampling period $\Delta t$, for different values of the duration of the sampling window, respectively corresponding to 50 samples (curve (I)), 70 samples (curve (II)), and 50 samples (curve (III)). To avoid overcomplicating the figure only the top parts of the secondary lobes are shown for the curves (I) and (II).

Comparing the three curves obtained, it is seen that only the value of the out-band attenuation A is affected by the variations in the duration of the sampling window.

Consequently, any low-pass filter characterized operationally by a given bandwidth B, a given out-band attenuation level A and a given shape factor SF can be synthesized in accordance with the invention by carrying out the following successive phases:

a first phase in which an expansion of the impulse response of the analog filter associated with the digital filter to be synthesized is calculated in the form of a weighted sum of M Hermite functions, the integer M being fixed by said shape factor SF;

a second phase of extracting the coefficients of the digital filter by sampling the impulse response obtained from the previous phase in a sampling window of duration T fixed by said out-band attenuation level A and with a sampling period $\Delta t$ fixed according to said bandwidth B.

All the above operations are naturally implemented in a digital computer programmed to carry out the various computations.

The benefit of the expansion using Hermite functions is the simplicity of the relationship between the transfer function of the filter and its impulse response, enabling direct calculation of the coefficients of the filter, i.e. the complexity of the filter, from the specification of the filter performance.

All of the above disclosure is restricted to the synthesis of a low-pass filter for signals with real values. The method of the invention can naturally be extended to complex signals. It is sufficient to apply the real low-pass filter to each of the phase and quadrature components forming any complex signal.

Furthermore, any type of band-pass filter can be obtained by synthesizing a low-pass filter as previously described: a first method consists in frequency translation of the transfer function of the synthesized low-pass filter. To obtain a band-pass filter centered on a predetermined frequency $f_0$ it is sufficient to multiply the expansion of the impulse response g(t) by a coefficient equal to $e^{2\pi j f_0 t}$. A second method consists in translating the signal to be filtered to the zero frequency before applying the low-pass filtering to it. This second method is preferable to the first method as it uses a minimal number of computations.

The benefit of the present invention lies in the fact that it is very easy to implement a filter device whose bandwidth and/or central frequency can be easily and quickly modified according to the filter operation to be carried out. It is sufficient to synthesize a low-pass filter once and for all by the method previously explained, fixing beforehand a particular stiffness SF, a particular out-band attenuation A and a particular bandwidth B that will constitute the minimal bandwidth of the filter device (see below). All of the coefficients of the digital filter obtained are then stored in a memory of the filter device.

When filtering samples of any input signal, it is possible to choose to multiply each of the coefficients of the filter in memory with a sample of the input signal and to sum all of the multiplications effected to obtain a filtered signal sample. This filtering will have the performance defined at the outset, in particular a bandwidth B.

If a filter with a bandwidth other than the bandwidth B is then required, it is not necessary with the synthesis method of the invention to start over all of the steps of synthesizing the filter. Starting with the initial filter of bandwidth B, a filter of bandwidth kB, k being an integer factor, can quickly be produced by using in the filter operation only a number of the coefficients in memory reduced by the factor k. To be more precise, if N represents the number of coefficients in memory after synthesizing a filter of bandwidth B, a filter of bandwidth kB is obtained using N/k samples from the samples in memory, i.e. a number of samples reduced by the factor k, for the multiplications with the samples of the input signal used in the filter operation. Using one sample every k stored samples amounts to modifying the sampling period which, as explained with reference to FIG. 4, leads to a proportionate modification of the bandwidth without influencing the shape factor or the out-band attenuation of the filter.

Figure 6:
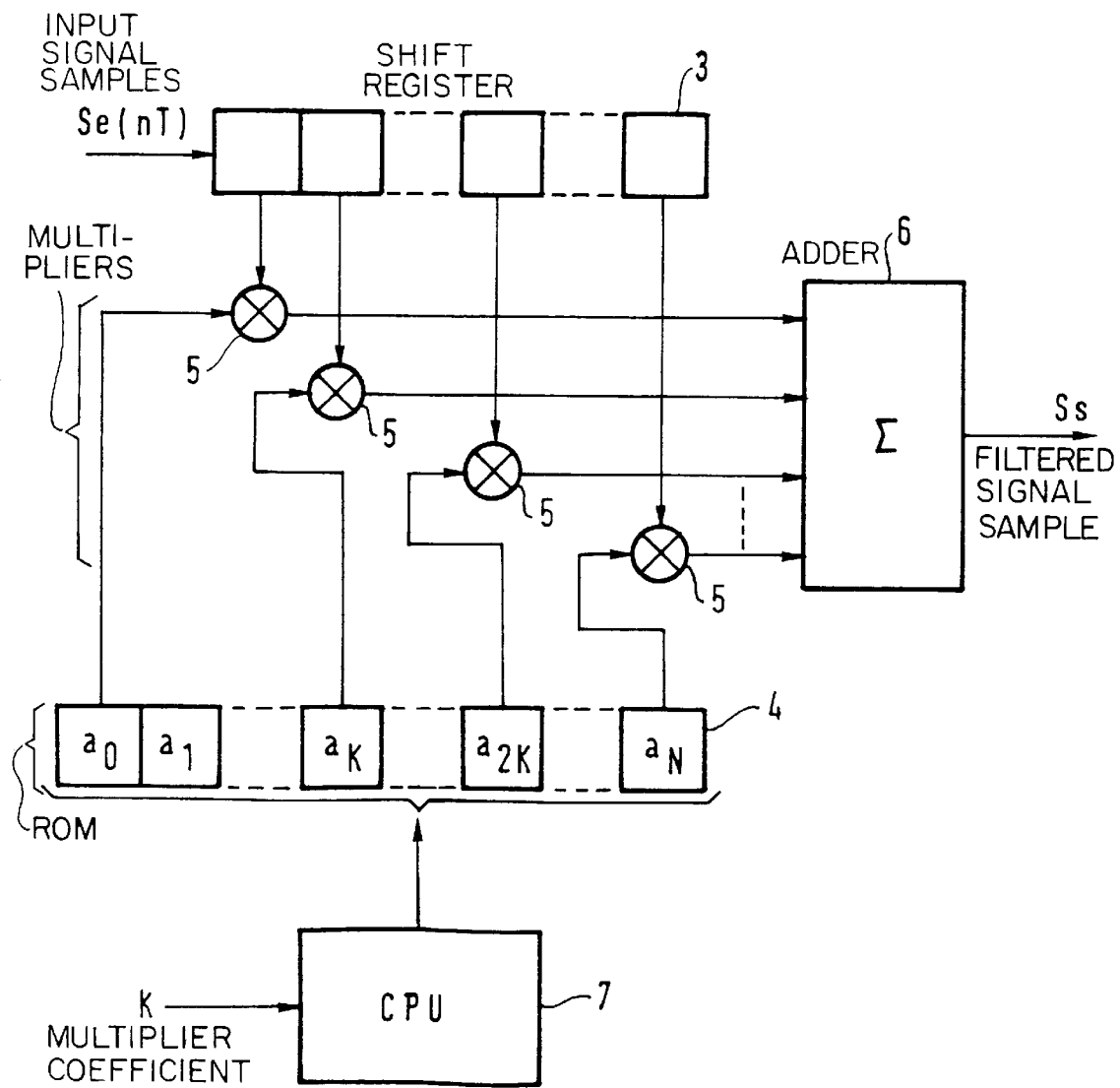
FIG. 6 represents in the form of a simplified block diagram the operations carried out by means of a filter in accordance with the invention.

FIG. 6 shows in the form of a simplified block diagram the various operations carried out during a filtering operation using a filter constituting one embodiment of the invention. The samples $S_e(nT)$ of an input signal to be filtered are stored in a shift register 3. The N coefficients $a_i$ extracted during previous synthesis of the filter by the method of the invention are stored in storage means 4, for example a read-only memory (ROM). For a filter operation with bandwidth B, each of the coefficients $a_i$ in memory is multiplied by a sample of the input signal stored in the shift register 3 by multipliers 5. The outputs of the multipliers 5 are then summed in an adder 6 to deliver a filtered signal sample $S_s$. The value of the sample is preferably calculated at the end of a time equal to the reciprocal of the bandwidth of the filter. All the above operations are carried out under the control of a control module 7, typically a microprocessor. The latter advantageously also serves as means of modifying the bandwidth of the filter and selecting a bandwidth that is a multiple of the minimal bandwidth B. If k is the multiplying coefficient, the control module 7 selects from the memory 4 only one coefficient $a_i$ every k coefficients to carry out the multiplications with a corresponding number of samples of the input signal.

There is claimed:

1. A method of synthesizing a finite impulse response digital filter for an input signal and outputting a filtered signal including a phase of storing samples of an input signal to be filtered, a phase of calculating the impulse response g(t) of an analog filter, the transfer function of which is defined by a predetermined bandwidth B, shape factor SF and out-band attenuation level A and a phase of extracting the coefficients of the digital filter by sampling said impulse response, a phase of multiplying the extracted coefficients by a sample of the input signal, a phase of summing outputs of multiplied extracted coefficients by the samples of the input signal to deliver said input signal, wherein said calculation phase consists in expanding said impulse response into an integer number M of Hennite functions predetermined in accordance with said shape factor SF and said coefficient extraction phase includes sampling of the expanded impulse response after said calculation phase in a time window the duration of which is dependent on said out-band attenuation level A using a sampling period $\Delta t$ that is dependent on said bandwidth B.

2. The method claimed in claim 1 wherein said calculation phase includes the following steps:

looking for a decomposition of the transfer function of the analog filter in the form of a sum of the first M even Hermite functions weighted by weighting coefficients such that the nth derivatives of said sum, n being an integer varying from 1 to 2M-1, are zero for the zero frequency;

deducing the expansion of the impulse response by inverse Fourier transformation of said sum.

3. The synthesis method claimed in claim 2 wherein said step of looking for said decomposition consists in solving the following linear system of M equations:

$$\sum_{i=0}^{M-1} a_i \psi_{2i}(0) = G$$

$$\sum_{i=0}^{M-1} a_i \psi_{2i}''(0) = 0$$

.
.
.

$$\sum_{i=0}^{M-1} a_i \psi_{2i}^{(2(M-1))}(0) = 0$$

in which G represents a constant value of the transfer function within the bandwidth B, $a_i$ represents said weighting coefficients, and $\psi_{2i}(\ )$ represents the 2ith Hermite function.

4. The method claimed in claim 1 wherein the coefficients extracted are stored in memory for application to samples of an input signal during a filtering operation and the bandwidth of said filter can be increased by an integer factor k by using for said filtering operation a number of the coefficients stored in memory reduced by said factor k.

5. The synthesis method claimed in claim 2 wherein the filter to be synthesized is to be centered on a predefined frequency $f_0$ and said method further includes a step of multiplying the expansion of the impulse response resulting from the calculation phase by a coefficient equal to $e^{2\pi j f_0 t}$.

6. Finite impulse response digital filter including means for storing coefficients extracted by previous synthesis of the filter by a method as claimed in any one of the preceding claims to implement a filter with predetermined minimal bandwidth B, shape factor SF and out-band attenuation A and means for modifying the bandwidth by selecting from the coefficients stored a number of samples reduced by a given factor k to enable a filtering operating with bandwidth kB on samples of an input signal.

* * * * *